United States Patent
Chapman et al.

(10) Patent No.: US 9,507,889 B2
(45) Date of Patent: Nov. 29, 2016

(54) DECOMPOSITION OF THE SEISMIC MOMENT TENSOR

(75) Inventors: Christopher Chapman, Great Shelford (GB); Walter Scott Leaney, Katy, TX (US); Adrian Alexander, St. Neots (GB)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 633 days.

(21) Appl. No.: 13/877,860

(22) PCT Filed: Oct. 6, 2011

(86) PCT No.: PCT/IB2011/054413
§ 371 (c)(1),
(2), (4) Date: Jun. 3, 2013

(87) PCT Pub. No.: WO2012/046206
PCT Pub. Date: Apr. 12, 2012

(65) Prior Publication Data
US 2013/0246023 A1     Sep. 19, 2013

(30) Foreign Application Priority Data

Oct. 8, 2010   (GB) .................................. 1016956.3

(51) Int. Cl.
*G06F 17/50*  (2006.01)
*G01V 1/30*  (2006.01)

(52) U.S. Cl.
CPC ............. *G06F 17/5009* (2013.01); *G01V 1/30* (2013.01)

(58) Field of Classification Search
CPC ...... G01V 1/30; G01V 17/5009; G01V 1/00; G01V 1/34; G01V 2210/123; E21B 41/0057; E21B 43/26; E21B 47/02; E21B 49/006
USPC ............................. 702/11, 14, 66; 367/38, 47
See application file for complete search history.

(56) References Cited

U.S. PATENT DOCUMENTS

| | | |
|---|---|---|
| 5,377,104 A | 12/1994 | Sorrells et al. |
| 7,647,183 B2 | 1/2010 | Jechumtalova et al. |
| 2005/0190649 A1 | 9/2005 | Eisner et al. |

(Continued)

OTHER PUBLICATIONS

Aki, et al.,, "Chapter 3: Representation of Seismic Sources", Quantitative Seismology, 2nd Edition, University Science Books, 2002, 35 pages.

(Continued)

*Primary Examiner* — John H Le

(57) ABSTRACT

Analysis of a seismic event, such as a microseismic event caused by hydraulic fracturing, comprises measuring seismic waves emitted by the event and converting the measurements into two values for magnitude of explosion or implosion and for magnitude of displacement discontinuity at a plane, together with two directions, a direction of a normal to the plane and a direction of displacement; where the two values and the two directions compose the moment tensor describing the seismic event. The measurements may be converted into the moment tensor and decomposed into the values and directions. The values and directions associated with several seismic events may be displayed concurrently on a graphic display as a graphic representation of multiple events, where each event may be depicted with magnitude of expansion or contraction represented by a volume and the plane represented as a laminar object.

17 Claims, 2 Drawing Sheets

(56) References Cited

U.S. PATENT DOCUMENTS

2009/0010104 A1    1/2009  Leaney
2009/0048783 A1    2/2009  Jechumtalova et al.
2010/0157730 A1    6/2010  Bradford

OTHER PUBLICATIONS

Backus, et al., "Moment Tensors and Other Phenomenological Descriptions of Seismic Sources—I. Continuous Displacements", Geophysical Journal of the Royal Astronomical Society vol. 46, 1976, pp. 341-361.
Backus, et al., "Moment Tensors and Other Phenomenological Descriptions of Seismic Sources—II. Discontinuous Displacements", Geophysical Journal of the Royal Astronomical Society vol. 47, 1976, pp. 301-329.
Baig, et al., "Microseisnnic moment tensors: A path to understanding frac growth", The Leading Edge, vol. 29, No. 3, Mar. 2010, pp. 320-324.
Ben-Menahem, et al., "Seismic Waves and Sources", Springer Verlag, 1981, p. 176.
Ben-Zion, Y., "On Quantification of the Earthquake Source", Seismological Research Letters, vol. 72 (2), 2001, pp. 151-152.
Burridge, et al., "Body Force Equivalents for Seismic Dislocations", Bulletin of the Seismological Society of America, vol. 54 (6), 1964, pp. 1875-1888.
Eisner, et al., "Beyond the dots in the Box: Microseismicity-constrained fracutre models for reservoir simulation", The Leading Edge, vol. 29 (3), 2010, pp. 326-333.
Eshelby, J.D., "The Determination of the Elastic Field of an Ellipsoidal Inclusion, and Related Problems", Proceedings of the Royal Society A, vol. 241, 1957, pp. 376-396.
Fedorov, F.D., "Theory of Elastic Waves in Crystals", Trans: Bradley, J.E. S. (Original in Russian, 1965, Nauka Press, Moscow), Plenum Press, New York, 1968, 12 pages.
Heaton, et al., "Static Deformations from Point Forces and Force Couples Located in Welded Elastic Poissonian Half-Spaces: Implications for Seismic Moment Tensors", Bulletin of the Seismological Society of America, vol. 79, No. 3, 1989, pp. 813-841.
Hudson, et al., "Source type plot for inversion of the moment tensor", Journal of Geophysical Research: Solid Earth, vol. 94 (B1), Jan. 10, 1989, pp. 765-774.
Jost, et al., "A Student's Guide to and Review of Moment Tensors", Seismological Research Letters, vol. 60, No. 2, 1989, pp. 37-57.
King, G.C.P., "Geological Faults: Fracture, Creep and Strain", Philopsophical Transactions of the Royal Society A, vol. 288, 1978, pp. 197-212.
Knopoff, et al., "The Compensated Linear-Vector Dipole: A Possible Mechanism for Deep Earthquakes", Journal of Geophysical Research, vol. 75 (26), 1970, pp. 4957-4963.
Riedesel, et al., "Display and Assessment of Seismic Moment Tensors", Bulletin of the Seismological Society of America, vol. 79 (1), 1989, pp. 85-100.
Robinson, K., "Elastic Energy of an Ellipsoidal Inclusion in an Infinite Solid", Journal of Applied Physics, vol. 22, 1951, pp. 1045-1054.
Sileny, et al., "Non-double-couple mechanisms of microearthquakes induced by hydraulic fracturing", 70th EAGE Conference and Exhibition, Rome, Italy, Jun. 9-12, 2008, 5 pages.
Vavrycuk, Vackav, "Focal Mechanisms in Anisotropic Media", Geophysical Journal International, vol. 161, 2005, pp. 334-346.
Vavrycuk, Vackav, "On the retrieval of moment tensors from borehole data", Geophysical Prospecting, vol. 55, 2007, pp. 381-391.
Vavrycuk, Vaclav, "Inversion for parameters of tensile earthquakes", Journal of Geophysical Research, vol. 106 (B8), 2001, pp. 16,339-16,355.
Warpinski, et al., "Source-Mechanism Studies on Microseismicity Induced by Hydraulic Fracturing", SPE 135254—SPE Annual Technical Conference and Exhibition, Florence, Italy, Sep. 19-22, 2010, pp. 1-18.

DECOMPOSITION OF THE SEISMIC MOMENT TENSOR

CROSS-REFERENCE TO RELATED APPLICATIONS

This application is a United States National Stage Application under 35 U.S.C. §371 and claims priority to PCT Application Number PCT/IB2011/054413 filed Oct. 6, 2011 which claims priority to British Patent Application Serial Number 1016956.3 filed Oct. 8, 2010. Both of these applications are incorporated herein by reference in their entireties.

FIELD OF THE INVENTION

This invention relates to monitoring of microseismic events, that is small seismic events which occur below ground as a result of changes in the stress within geological formations. Monitoring of microseismic events is a way to observe, remotely, events taking place below ground. Examples of fields where microseismic monitoring can be useful are hydraulic fracturing, where the microseismics give evidence of the location, time and nature of the fractures produced, reservoir monitoring, where microseismics give evidence of changes in stress in the reservoirs due to production and pumping, waste disposal, where the injection may cause events on existing or new faults, carbon sequestration, where events may be caused by the pressure of injected $CO_2$ which threaten the integrity of the storage reservoir, and monitoring large infrastructures such as dams and reservoirs, where the load or changes in underground water may cause events which threaten the structures.

BACKGROUND OF THE INVENTION

In conventional seismic monitoring one or more seismic sources, such as airguns, vibrators or explosives are activated and generate sufficient acoustic energy to penetrate the earth. Reflected or refracted parts of this energy are then recorded by seismic receivers such as hydrophones and geophones.

In passive seismic monitoring there is no actively controlled and triggered source. The seismic energy is generated through so-called microseismic events caused by subterranean shifts and changes that at least partially give rise to acoustic waves which in turn can be recorded using the known receivers. These microseismic events may be the result of human activity, such as pumping a pressurized fluid into a subterranean location to create a hydraulic fracture. Passive seismic monitoring has some similarity to the study of earthquakes, in that the time and location of a seismic event is not known beforehand, while the obvious difference is that an earthquake is a much more energetic and spatially distributed seismic event.

It is well known that the characteristics of a seismic event can be expressed as the moment tensor and many textbooks and papers have accepted that the moment tensor is an appropriate way to describe a small seismic source. The moment tensor is a three by three symmetric matrix of values which give the magnitudes of all the possible force couples. Its name arises because it has the units of force times distance, hence a moment.

At a seismic event there is a localized, transient, failure of the constitutive law of elasticity. The difference between the model stress calculated from the constitutive law of elasticity and the true stress is referred to as the stress glut: thus $$\sigma_{glut} = \sigma_{model} - \sigma_{true} \quad (E1)$$

The moment tensor M is the integral of the rate of change of the stress glut over the volume and time period in which the seismic event occurs:

$$M = \int_{0-}^{T} \int_{V_S} \frac{\partial \sigma_{glut}}{\partial t} \, dV \, dt = \int_{V_S} [\sigma_{glut}] \, dV \quad (E2)$$

where T is the duration of the event (which we assume occurs at time zero),
$V_S$ is the volume of the source (i.e. seismic event), and
$[\sigma_{glut}]$ is the change (saltus) of the stress glut during the event.

Provided the seismic event is small compared with the seismic wavelength and is of short duration (both of which are normally the case for a microseismic event) it can be regarded as a point source and the stress glut can be written as $$\sigma_{glut}(x,t) = MH(t)\delta(x - x_S) \quad (E3)$$

where H(t) is the Heaviside step function, $\delta(x)$ is the three-dimensional Dirac delta function, and $x_S$ is the location of the point source.

It is well known that for a small and short seismic event which can be regarded as a point source, the particle displacement, i.e. the displacement at one or more receivers, which may be observed as velocity or acceleration, is related to the moment tensor by the Green function:

$$u(t, x_R) = G_\alpha(t, x_R, x_S) : M \quad (E4)$$

where u is the particle displacement, $G_\alpha$ is the third-order stress Green tensor and: is the scalar product, or contraction over two indices, of the tensors. The Green function can be calculated for the elastic Earth model using a known technique, e.g. ray theory or finite-difference method. Determining the moment tensor is then a linear inverse problem and methods to analyze a linear inverse problem are well known.

A description of the moment tensor to describe a point source seismic event is given in Section 3.3 of Aki and Richards (2002). Observing the moment tensor from seismic data is referred to in U.S. Pat. Nos. 5,377,104 and 7,647,183 and US published applications 2005/0190649 and 2010/0157730.

The subsequent step of interpretation of the moment tensor presents difficulties. It is desirable to decompose the moment tensor into other quantities in order to obtain a physical interpretation of the seismic event. There is a standard decomposition of seismic moment tensors, which has been used in earthquake studies and in microseismic monitoring. This is to decompose the moment tensor using its principal values (usually termed eigenvalues) and its axes, i.e.

$$M(\hat{T} \ \hat{N} \ \hat{P}) = (\hat{T} \ \hat{N} \ \hat{P}) \begin{pmatrix} \Lambda_T & 0 & 0 \\ 0 & \Lambda_N & 0 \\ 0 & 0 & \Lambda_P \end{pmatrix} \quad (E5)$$

The eigenvalues are ordered, i.e.

$$\Lambda_T \geq \Lambda_N \geq \Lambda_P \quad (E6)$$

and the corresponding axes are known as the tension, $\hat{T}$, neutral, $\hat{N}$, and pressure, $\hat{P}$, axes. The principal axes describe the orientation of the seismic event, and the principal values the nature or type of seismic event. The standard method of interpretation is to transform these eigenvalues into parts that represent certain basic types of seismic event, e.g. one or more of an explosion, dipole(s), double couple(s), compensated linear vector dipole(s) (Knopoff and Randall, 1970; Jost and Herrmann, 1989; Riedesel and Jordan, 1989). Unfortunately the decomposition is always non-unique.

Many physical models generate the same moment tensor. The usual approach when implementing this standard method of decomposition is to choose the two simplest types of seismic event which are explosion and slip on a fault. However such decomposition leads to a value for explosion, a value for slip on a fault and a remainder which is not easy to interpret. More difficulty in interpretation arises if the geological formation in which the seismic event occurs is anisotropic or if the so-called displacement discontinuity (the movement of one portion of the formation relative to another) is not confined to slip on a fault but includes movement of one portion towards or way from another, for instance when a hydraulic fracture opens or closes.

SUMMARY OF THE INVENTION

Broadly the present invention provides a method of analysing an underground seismic event comprising:
receiving and measuring seismic waves emitted by the seismic event; and
converting the measurements of the seismic waves into
  a value for magnitude of explosion or implosion,
  a value for magnitude of displacement discontinuity at a plane,
  the direction of a normal to that plane, and
  a direction of displacement;
where the two said values and the two said directions compose the whole moment tensor describing the seismic event. Of course, once the two directions have been obtained, the angle between them, i.e. the angle between the displacement direction and the normal to the plane follows directly. The terms "explosion" and "implosion" are customary terms in the field of seismic studies. They denotes that a seismic event involves expansion or contraction but they do not specify the cause of the expansion or contraction.

In some forms of the invention the method includes a step of converting the measurements of the seismic waves to values in a moment tensor describing the event; and then carrying out a novel decomposition of the moment tensor into the magnitude value for explosion, the magnitude value for displacement discontinuity at a plane, the direction of a normal to that plane, and the displacement direction, where the two said values and two said directions compose the whole of the said moment tensor.

However, it is within the scope of this invention to proceed from the measurements to the values and directions without going through the intermediate stage of converting to a moment tensor.

The reception and measurement of seismic signals may be carried out with known receiving devices such as geophones or hydrophones. The conversion of the measurements into the values and directions may be carried out by a program running on a digital computer and the values and directions so obtained may be stored in computer memory and/or output from the computer. Such output may take various forms, including display on a monitor or other display device, or printing to paper, or storage in a portable form of non-volatile memory, or transmission over a network such as transmission to another computer. The output may be machine readable data, data in alphanumerical characters or output to drive a graphic display.

In some forms of this invention, values and directions are obtained in accordance with this invention for a number of seismic events and are output so as to be shown concurrently as a graphic representation. This may be output as a graphic display on a monitor or other display device or may be printing as a graphic. Each seismic event may then be represented by objects and/or symbols at a point in the graphic corresponding to the location (or the centre of the location) of the seismic event. A graphic display may be such that some of the said values and/or directions are displayed while others are hidden.

It is possible that the output from a computer will not be the values and directions directly obtained by the decomposition procedure but will instead consist of or include data obtainable through further processing of the values and directions.

The output may at least include (i) a value indicating magnitude of explosion or implosion and (ii) data indicating the said plane. Preferred possibilities for such graphic representation are:
  value of the volume change due to the explosion (or implosion) represented as a sphere or other volume;
  displacement discontinuity plane, i.e. fault plane, represented as a laminar object, for example a disc, pictured as lying in the plane;
  displacement direction indicated by an arrow or other linear element.

The value of the multiplication product of the displacement discontinuity times the fault area may be represented by the size of the laminar object and by the length of the linear element.

DETAILED DESCRIPTION

Figure 1:
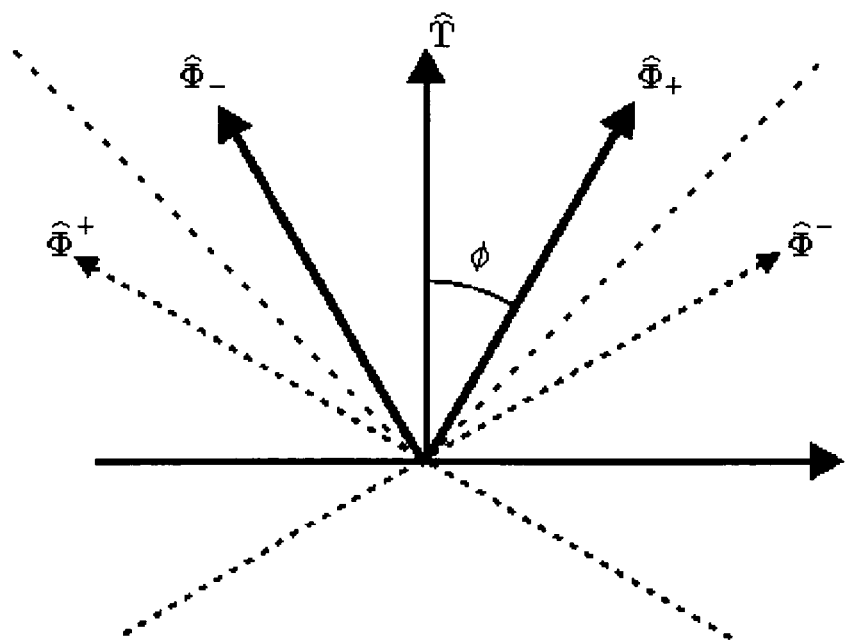
FIG. 1 is a diagram showing the angle and bi-axes in the plane of the tension, $\hat{T}$ and pressure, $\hat{P}$ principal axes.

The reception of seismic waves from a seismic event and the measurement of those waves may be carried out using known apparatus and the measured data may be converted to a moment tensor or other data suitable for further calculation by known techniques. The present invention then envisages a novel decomposition of the moment tensor.

The following description will first explain the two values and two directions which are the novel decomposition of the moment tensor and then explain how the decomposition of the moment tensor can be carried out.

It has previously been pointed out that the stress glut and the stress free strain are equivalent descriptions of a seismic event. See Backus and Mulchay (1976a,b) and see also Robinson (1951) and Eshelby (1957) for introduction of the term stress free strain. The stress-free strain is the strain that the region of the seismic event would undergo if the surrounding material were not present. It can be calculated from the stress glut as $$e_{free} = s : \sigma_{glut} \quad \text{(E7)}$$
$$= e_{model} - s : \sigma_{true}$$

where S is the fourth-order compliance tensor. Note that the stress-free strain is not the difference between the model and true strains, as can be seen from the definition and the final expression in equation (E7), which is not the true strain.

The integral of the rate of change of the stress-free strain over the volume and time period in which the seismic event occurs is $$D = \int_{0-}^{T}\int_{V_S} \frac{\partial e_{free}}{\partial t} dV dt = \int_{V_S} [e_{free}] dV \quad (E8)$$

where T is the duration of the event (which commences at time zero), $V_S$ is the volume of the source, and $[e_{free}]$ is the change (saltus) of the stress free strain during the event. For a seismic event which can be regarded as a point source:

$$e_{free} = DH(t)\delta(x-x_S) \quad (E9)$$

where H(t) is the Heaviside step function, $\delta(x)$ is the three-dimensional Dirac delta function, and $x_S$ is the location of the source.

We refer to the term D as the potency tensor. This tensor has not previously been described in the literature but the term 'potency' has previously been used for a scalar term derived from a scalar moment magnitude.

The potency tensor is next decomposed by a method which can be applied to any real, symmetric, second-order tensor (Fedorov 1968 see page 72) which is referred to here as biaxial decomposition. The eigen-decomposition for the potency tensor is $$D(\hat{X}_1 \ \hat{X}_2 \ \hat{X}_3) = (\hat{X}_1 \ \hat{X}_2 \ \hat{X}_3)\begin{pmatrix} \Delta_1 & 0 & 0 \\ 0 & \Delta_2 & 0 \\ 0 & 0 & \Delta_3 \end{pmatrix} \quad (E10)$$

where $\Delta_1 \geq \Delta_2 \geq \Delta_3$ are the ordered real eigenvalues, and $\hat{X}_i$ are the corresponding orthonormal eigenvectors.

The potency tensor can then written in the dyadic expansion $$D = \Delta_1 \hat{X}_1 \hat{X}_1^T + \Delta_2 \hat{X}_2 \hat{X}_2^T + \Delta_3 \hat{X}_3 \hat{X}_3^T \quad (E11)$$

$$= \Delta_2 I + (\Delta_1 - \Delta_2)\hat{X}_1 \hat{X}_1^T - (\Delta_2 - \Delta_3)\hat{X}_3 \hat{X}_3^T$$

We define an angle $\phi$ from $$\cos\phi = \left|\sqrt{\frac{\Delta_1 - \Delta_2}{\Delta_1 - \Delta_3}}\right|, \quad (E12)$$

$$\sin\phi = \left|\sqrt{\frac{\Delta_2 - \Delta_3}{\Delta_1 - \Delta_3}}\right|$$

which will be real and $0 \leq \phi \leq \pi/2$ because of the ordering. The next step is to define the unit vectors $$\hat{\Phi}_\pm = \cos\phi \hat{X}_1 \pm \sin\phi \hat{X}_3 \quad (E13)$$

which we will call the bi-axes. The potency tensor (E11) can then be rewritten $$D = \Delta_2 I + \frac{\Delta_1 - \Delta_3}{2}(\hat{\Phi}_+\hat{\Phi}_-^T + \hat{\Phi}_-\hat{\Phi}_+^T) \quad (E14)$$

An advantage of this biaxial decomposition given in (E14) over the eigen-decomposition given in (E10) and (E11) is that it remains valid for degeneracies, i.e. for $\Delta_1 = \Delta_2 = \Delta_3$ when the bi-axes are not required, for $\Delta_1 = \Delta_2$ when $\phi = \pi/2$, and for $\Delta_2 = \Delta_3$ when $\phi = 0$.

The bi-axes are illustrated in FIG. 1, which shows the bi-axes $\hat{\Phi}_\pm$ in the plane of the $\hat{T}$ and $\hat{P}$ principal axes. In addition FIG. 1 shows the planes perpendicular to the bi-axes $\hat{\Phi}_\pm$ as broken lines denoted with the dual vectors $\hat{\Phi}^\pm$ where $$\hat{\Phi}^\pm = \pm\hat{X}_2 \times \hat{\Phi}_\pm \quad (E15)$$

FIG. 1 also shows the angle $\phi$ between one of the bi-axes and the $\hat{T}$ principal axis, while two more broken lines indicate the usual fault and auxiliary planes at an angle $\phi = \pi/4 = 45°$ to the $\hat{T}$ principal axis.

Equation (E14) could be used to decompose any potency tensor. The first term in (E14) represents an isotropic strain event and the second is a dyadic form that represents a displacement discontinuity on a fault. However, in anisotropic media, an isotropic stress event such as a change in hydrostatic pressure, will not bring about a strain event which is also isotropic: on the contrary an anisotropic strain will occur. In such circumstances it would be difficult to give a physical interpretation of the first term in equation (E14). Therefore, in order to decompose the moment tensor in accordance with the biaxial decomposition set out above, we first subtract an isotropic stress event (in effect representing a seismic event which is solely expansion or contraction) from the moment tensor so as to leave a tensor representing a seismic event which is displacement discontinuity alone. Consequently, in the biaxes decomposition of the remaining potency tensor, the isoptropic part is zero. The subtraction from the moment tensor is $$M_{DD} = M - M_{EXP}I \quad (E16)$$

where $M_{EXP}$ is the scalar magnitude of the isotropic stress event causing expansion or contraction and I is the identity tensor.

In order that $M_{DD}$ is a moment tensor for a seismic event consisting solely of displacement discontinuity, $M_{EXP}$ must be such that the intermediate eigenvalue $\Delta_2$ of the potency tensor from $M_{DD}$ is zero.

In order to determine $M_{EXP}$ we begin with an arbitrary value for $M_{EXP}$. We reduce the remaining part of the moment tensor to its potency tensor $$D = s:M_{DD} \quad (E17)$$

and find its eigen-decomposition in accordance with equation (E10). $M_{EXP}$ is adjusted iteratively until $\Delta_2$ becomes zero.

Various iterative computational processes can be used to adjust $M_{EXP}$ until $\Delta_2$ becomes zero. We have used the function 'fzero' in MATLAB (MATLAB® is a registered trademark of The MathWorks™) to find the zero solution but any bisection/secant or similar algorithm will work. References for the algorithm used in fzero can be found in the MATLAB documentation. The root is straightforward to bracket as for $M_{EXP}$ large and positive (a large pressure), the eigenvalues will be negative from the resultant compression, and vice-versa for a large negative value. Once the root is bracketed, the algorithm will be robust.

Having found $M_{EXP}$ we complete the biaxial decomposition (E14) using (E12) and (E13), and identify it with a displacement-discontinuity source. Thus the moment tensor can be written $$M = V_S[P]I + \tfrac{1}{2}A[d]c:(\hat{d}\hat{n}^T + \hat{n}\hat{d}^T) \quad (E18)$$

where $$V_S[P] = M_{EXP} \quad (E19a)$$

$$A[d] = \Delta_1 - \Delta_3 \quad (E19b)$$

$$\hat{d} = \hat{\Phi}_+ \quad (E19c)$$

$$\hat{n} = \hat{\Phi}_- \quad (E19d)$$

Figure 2:
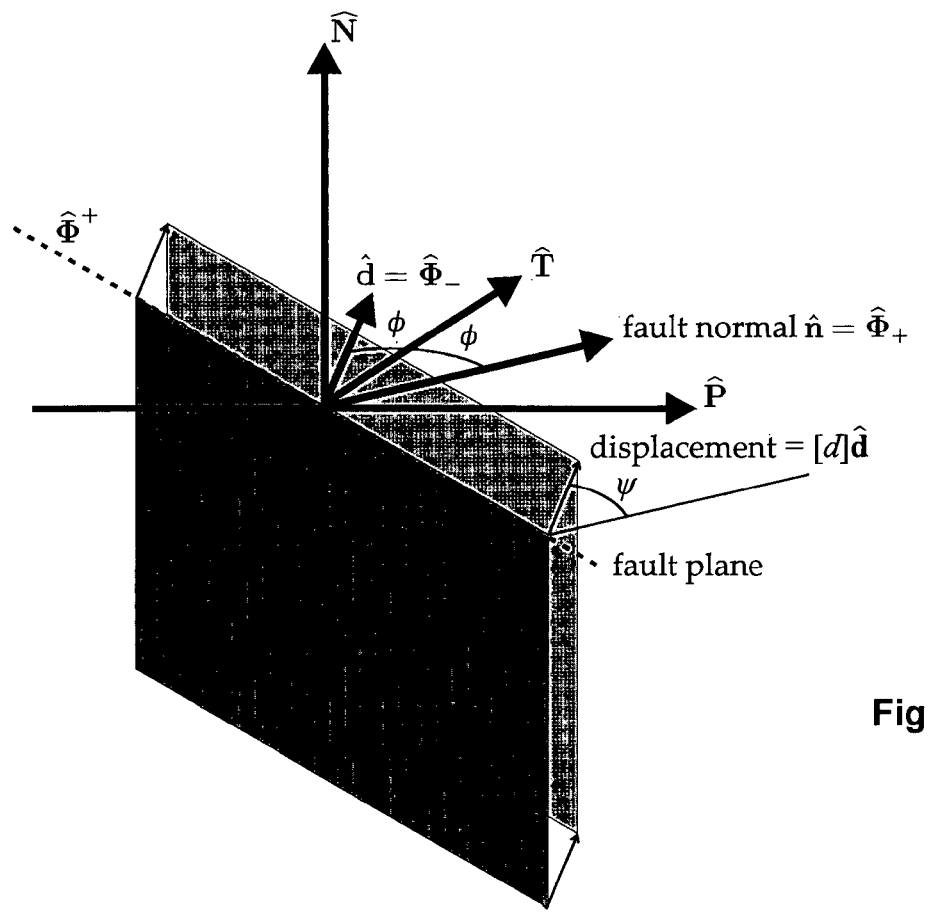
FIG. 2 diagrammatically illustrates displacement discontinuity.

In the explosive part (E19a), $V_S$ is the volume of the seismic event and [P] is the pressure step, and in the displacement discontinuity, the fault area is A and the discontinuity is [d]. This is illustrated in FIG. 2 which shows the fault plane normal to $\hat{n}=\hat{\Phi}_+$ with displacement discontinuity [d] in the direction $\hat{d}=\hat{\Phi}_-$. The angle between the fault normal and the displacement direction is $\psi=2\phi$. The advantage of the biaxial decomposition of the potency tensor (E18) is that it is complete and always possible whatever the moment tensor values, and that it represents a physically sensible model. Because a general anisotropic compliance tensor can be used to obtain the potency tensor (E17), another advantage of the method is that it is valid in any anisotropic medium (where the standard decomposition would lead to an output which is hard to interpret). The only ambiguity that remains, which may be removed using geological information about the rock formation and geological environment is that the choice of fault normal and displacement direction, (E19c) and (E19d) can be interchanged.

EXAMPLE

As a test of the bi-axial decomposition procedure, data for a seismic event with random explosive part, random vectors $\hat{n}$ and $\hat{d}$, and random area-displacement, in a transversely isotropic medium (a simple case of an anisotropic medium) were generated and had values $$M_{EXP} = 0.8407 \quad \text{(E20a)}$$

$$\hat{n} = \begin{pmatrix} 0.2866 \\ 0.9179 \\ 0.2745 \end{pmatrix} \quad \text{(E20b)}$$

$$\hat{d} = \begin{pmatrix} 0.9180 \\ 0.3457 \\ 0.1942 \end{pmatrix} \quad \text{(E20c)}$$

$$A[d] = 0.8980 \quad \text{(E20d)}$$

These data were combined with values for an example of a transversely isotropic medium with a vertical axis of symmetry (Green Horn shale) which were $$C_{11}=34.3, C_{33}=22.7, C_{44}=5.4, C_{65}=10.6, C_{13}=10.7 \quad \text{(E21)}$$

(the units are not important) and the moment tensor which was derived was $$M = \begin{pmatrix} 13.1912 & 8.9642 & 1.4920 \\ 8.9642 & 14.2235 & 1.3247 \\ 1.4920 & 1.3247 & 7.5052 \end{pmatrix} \quad \text{(E22)}$$

The algorithm described above recovered the exact values (E20) subject to sign and interchanging ambiguities in (E20c) and (E20d). The potency tensor was $$D = \begin{pmatrix} 0.2363 & 0.4228 & 0.1381 \\ 0.4228 & 0.2850 & 0.1227 \\ 0.1381 & 0.1227 & 0.0479 \end{pmatrix} \quad \text{(E23)}$$

As the bi-axes are not perpendicular (the angle between vectors (E20b) and (E20c) is about 50.7°) this decomposition differs from the standard fault-slip model.

Figure 3:
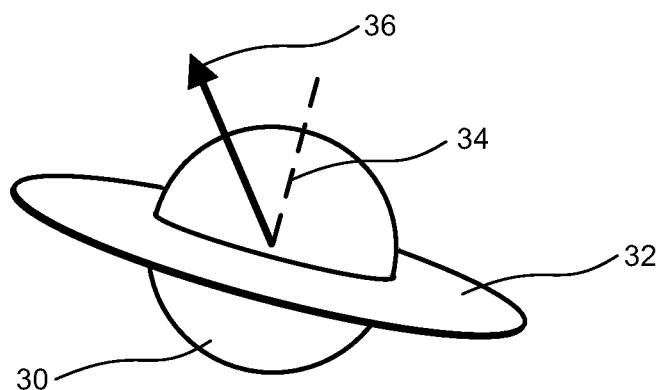
FIG. 3 illustrates a display glyph.

FIG. 3 illustrates a graphic representation of a seismic event. The event is represented as a shaped object, here referred to as a glyph. The magnitude of explosion is depicted by a sphere 30 whose size indicates the magnitude of the volume change due to explosion or implosion. One colour may be chosen for spheres denoting expansion and a contrasting colour chosen for spheres denoting contraction. The plane is denoted by a disc 32 and the size of the disc 32 is proportional to the magnitude of displacement. The normal to the plane is denoted here by a broken line 34. The displacement direction is indicated by arrow 36. The area of the disc 32 and the length of the arrow 36 are scaled to represent the product A[d] given as (E19b) above.

Figure 4:
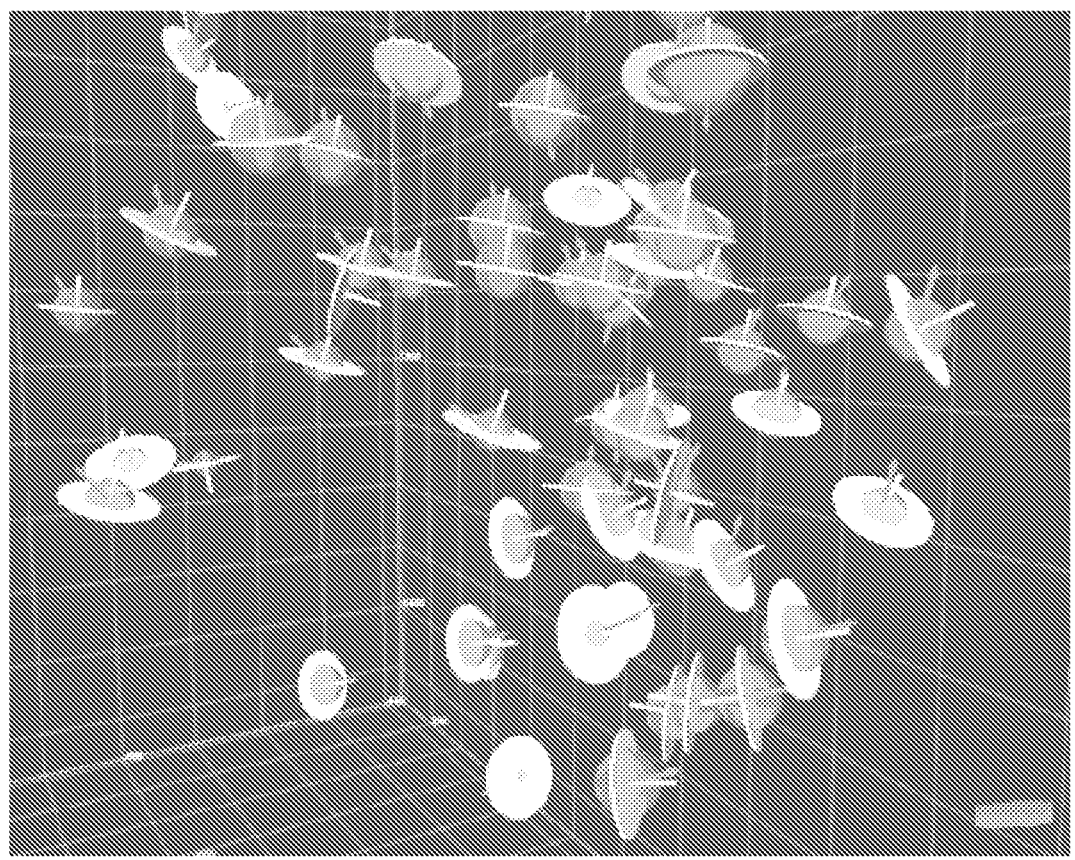
FIG. 4 illustrates a display of multiple glyphs.

Such glyphs may be shown as a picture or as a graphic display in two dimensions or in three dimensions, using known computer graphics techniques. FIG. 4 is an illustration of one such display.

REFERENCES

The following are mentioned in the text above:

Aki, K. and Richards, P. G., 2002. Chapter 3 of *Quantitative Seismology*, $2^{nd}$ Ed., University Science Books.

Backus, G. and Mulcahy, M., 1976a. Moment tensors and other phenomenological descriptions of seismic sources—I. Continuous displacements, *Geophys. J. R. Astr. Soc.*, 46, 341-61.

Backus, G. and Mulcahy, M., 1976b. Moment tensors and other phenomenological descriptions of seismic sources—II. Discontinuous displacements, *Geophys. J. R. Astr. Soc.*, 47, 301-29.

Eshelby, J. D., 1957. The determination of the elastic field of an ellipsoidal inclusion, and related problems, *Proc. R. Soc. Lond. A*, 241, 376-96.

Fedorov, F. D., 1968. Theory of Elastic Waves in Crystals, Trans: Bradley, J. E. S. (original in Russian, 1965, Nauka Press, Moscow), Plenum Press, New York.

Robinson, K., 1951. Elastic energy of an ellipsoidal inclusion in an infinite solid, J. Appl. Phys., 22, 1045-54

The invention claimed is:

1. A method of analysing an underground seismic event comprising:
   performing a hydraulic fracturing which causes a seismic event;
   receiving and measuring seismic waves emitted by the seismic event using one or more seismic data recording devices;
   converting the measurements of the seismic waves using a digital computer into
     a value for magnitude of explosion or implosion,
     a value for magnitude of displacement discontinuity at a plane,
     the direction of a normal to that plane, and
     a direction of displacement;
   where the two said values and the two said directions compose a whole moment tensor describing the seismic event;
   outputting the two said values and the two said directions; and
   analyzing the underground seismic event caused by the hydraulic fracturing.

2. A method according to claim 1 where at least some of the values and directions and/or information derived therefrom are output from the computer.

3. A method according to claim 2 wherein output from the computer indicates magnitude of explosion or implosion and also indicates the orientation of said plane or the direction of the normal thereto.

4. A method according to claim 3 wherein the output is in the form of alphanumeric characters.

5. A method according to claim 3 wherein the output is a graphic display.

6. A method according to claim 2 wherein the output is in the form of alphanumeric characters.

7. A method according to claim 2 wherein the output is a graphic display.

8. A method according to claim 1 wherein values and directions are obtained for a plurality of seismic events and at least some of the values and directions and/or information derived therefrom associated with each seismic event are output to a graphic display so as to be shown concurrently as a graphic representation of more than one event.

9. A method according to claim 8 wherein each seismic event is represented in the display by an object or symbol at a position corresponding to the location of the seismic event.

10. A method according to claim 9 wherein magnitude of explosion or implosion is represented by the volume of an object.

11. A method according to claim 9 wherein the said plane is represented as a laminar object.

12. A method according to claim 9 wherein the displacement direction is represented by a linear object.

13. A method according to claim 1 wherein the output is in the form of alphanumeric characters.

14. A method according to claim 1 wherein the output is a graphic display.

15. A method of analysing an underground seismic event comprising:
 causing a seismic event;
 receiving and measuring seismic waves emitted by the seismic event using geophones or hydrophones;
 converting the measurements of the seismic waves using a digital computer into
  a value for magnitude of explosion or implosion,
  a value for magnitude of displacement discontinuity at a plane,
  the direction of a normal to that plane, and
  a direction of displacement;
 where the two said values and the two said directions compose the whole moment tensor describing the seismic event;
 outputting the two said values and the two said directions; and
 analyzing the underground seismic event caused by the hydraulic fracturing.

16. A method according to claim 15 wherein the output is in the form of alphanumeric characters.

17. A method according to claim 15 wherein the output is a graphic display.

* * * * *